US009116660B1

(12) United States Patent
Widmann et al.

(10) Patent No.: US 9,116,660 B1
(45) Date of Patent: Aug. 25, 2015

(54) MIDPLANE FOR ORTHOGONAL DIRECT CONNECTION

(71) Applicants: Christopher A. Widmann, Apex, NC (US); John Kruszewski, Cary, NC (US); Richard Leath, Berkeley, CA (US); Alice Meng, Truckee, CA (US)

(72) Inventors: Christopher A. Widmann, Apex, NC (US); John Kruszewski, Cary, NC (US); Richard Leath, Berkeley, CA (US); Alice Meng, Truckee, CA (US)

(73) Assignee: EXTREME NETWORKS, INC., San Jose, CA (US)

( * ) Notice: Subject to any disclaimer, the term of this patent is extended or adjusted under 35 U.S.C. 154(b) by 113 days.

(21) Appl. No.: 13/842,475

(22) Filed: Mar. 15, 2013

Related U.S. Application Data

(60) Provisional application No. 61/696,093, filed on Aug. 31, 2012.

(51) Int. Cl.
*H05K 1/11* (2006.01)
*H05K 1/14* (2006.01)
*G06F 1/16* (2006.01)

(52) U.S. Cl.
CPC ........................................ *G06F 1/16* (2013.01)

(58) Field of Classification Search
USPC .......................................... 361/728–730, 792
See application file for complete search history.

(56) References Cited

U.S. PATENT DOCUMENTS

| | | | |
|---|---|---|---|
| 6,437,992 B1 * | 8/2002 | Carney et al. ................. | 361/796 |
| 6,833,996 B2 * | 12/2004 | Haworth ....................... | 361/730 |
| 7,722,359 B1 * | 5/2010 | Frangioso et al. ............. | 439/61 |
| 7,885,066 B2 * | 2/2011 | Boyden et al. ................ | 361/695 |
| 8,064,200 B1 * | 11/2011 | West et al. .................... | 361/695 |
| 8,630,087 B1 * | 1/2014 | Reynov et al. ............. | 361/679.5 |
| 8,800,884 B2 * | 8/2014 | Dufresne et al. ............. | 236/49.3 |
| 2003/0214781 A1 * | 11/2003 | Kolb et al. .................... | 361/687 |
| 2012/0120596 A1 * | 5/2012 | Bechtolsheim .......... | 361/679.48 |

* cited by examiner

*Primary Examiner* — Hung S Bui
(74) *Attorney, Agent, or Firm* — Blakely, Sokoloff, Taylor & Zafman

(57) ABSTRACT

A novel midplane is shaped with voids through which a dataplane connection is made between components on one side of the midplane and components on the opposite side of the midplane. The voids in the novel midplane offer numerous advantages in the design of network devices, including improved cooling performance, minimizing rack unit space and maximizing interface density, improved signal integrity allowing greater bandwidth through elimination of midplane signaling connections, improved upgradability of orthogonal direct connectors with little or no impact on the midplane or chassis, and proper alignment between the components of the dataplane.

16 Claims, 7 Drawing Sheets

MIDPLANE FOR ORTHOGONAL DIRECT CONNECTION

CROSS-REFERENCE TO RELATED APPLICATIONS

This application claims the benefit of a provisional application, Application Ser. No. 61/696,093, entitled MIDPLANE FOR ORTHOGONAL DIRECT CONNECTION, filed on Aug. 31, 2012.

TECHNICAL FIELD

The present invention relates to the field of computer networks and internetworking communications technologies. In particular, the present invention relates to midplanes for use in network switches.

COPYRIGHT NOTICE/PERMISSION

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright © 2013, Extreme Networks, Inc., All Rights Reserved.

BACKGROUND AND RELATED ART

Network switches are typically enclosed within a chassis-based architecture that employs a midplane for interconnecting electronic components on one side of the midplane to corresponding components on the other side of the midplane. For example, an input/output (I/O) blade on one side of a midplane may be interconnected to a fabric module on the other side of the midplane to form a dataplane that supports a certain data rate throughput in the network switch. The interconnection is achieved through the use of a midplane connector.

Some of the challenges in the design of the midplane include providing sufficient airflow for thermal cooling within a small area while maintaining signal integrity across the electronic components, such as the components of the dataplane. Advances in connector technology have opened the way toward more efficient midplane design in network switches. For example, orthogonal midplane connectors allow electrical components to mate orthogonally across the midplane which allows greater flexibility in the design of components within the chassis. More recently available are orthogonal connectors that directly connect components to one another, bypassing the midplane entirely.

SUMMARY

According to one aspect of the invention, a midplane is shaped to create voids in the midplane that allow orthogonal direct connection of components, the midplane providing power, control connectivity and mechanical alignment and/or registration for the components.

According to one aspect of the invention, components positioned on one side of the midplane are orthogonally and directly connected through one or more voids to corresponding components positioned on the opposite side of the midplane. In a typical embodiment, the orthogonally and directly connected components are connected through the voids using connectors to form a dataplane, and include I/O blades positioned horizontally on the one side of the midplane and fabric modules positioned vertically on the opposite side of the midplane (or, alternatively, the I/O blades could be positioned vertically on one side and the fabric modules positioned horizontally on the opposite side). During operation each I/O blade is orthogonally directly connected to one or more fabric modules through one or more voids of the midplane. Conversely, each fabric module is orthogonally directly connected to one or more I/O blades through the one or more voids of the midplane.

According to one aspect of the invention, the midplane is composed of a frame containing structural members disposed transversely to one another and oriented in a single plane to create voids through which the components are connected. For example, in one embodiment, the midplane frame is a windowpane-like structure that contains several vertical and horizontal members to create voids in the shape of rectangular openings, or windows, through which components on one side of the midplane are orthogonally and directly connected to corresponding components on the opposite side of the midplane. In a typical embodiment, the voids are sufficiently large in size and number to accommodate a plurality of orthogonally directly connected components at the components' points of intersection. In addition, the voids advantageously allow airflow in both directions, front to back or back to front.

According to one aspect of the invention, the power and other non-datapath connections for components supported by the midplane can be located on outermost structural members of the midplane frame making them more accessible than they would otherwise be. For example, in a typical embodiment, a power bus bar is affixed to an outermost vertical member of the midplane (left or right, depending on the design) to carry power down the midplane for the I/O blades, while an outermost horizontal member of the midplane (top or bottom, depending on the design) is configured with the non-datapath connections required to support the fabric modules and I/O blades that form the dataplane. In a typical embodiment, the inner structural members of the midplane carry non-datapath control signals and power connections between connectors.

According to one aspect of the invention, the midplane facilitates the mechanical registration and/or alignment of the components connected within the voids. For example, in one embodiment, the vertical and horizontal members of the midplane frame are equipped with alignment pins for mechanical registration and/or alignment of the components being directly and orthogonally connected through the voids to form a dataplane. In a typical embodiment, the vertical members contain alignment pins protruding from one side (e.g. the blade side) of the midplane to mechanically align the horizontally positioned I/O blades of the dataplane. Similarly, the horizontal members contain alignment pins protruding from the opposite side (e.g. the fabric side) of the midplane to mechanically align the vertically positioned fabric modules of the dataplane.

According to one aspect of the invention, once properly aligned and/or registered, the components on one side of the midplane are orthogonally and directly connected to corresponding components on the other side of the midplane through the voids of the midplane. The components are connected at the components' respective points of intersection using orthogonal direct connectors that connect components without attaching to the midplane. For example, the horizontally positioned I/O blades of a dataplane can be orthogonally and directly connected to one or more intersecting vertically positioned fabric modules of the dataplane across however many voids the intersections span using an orthogonal direct connector at each intersection.

In addition to the aspects and advantages of the present invention described in this summary, further aspects and advantages of the present invention will become apparent to one skilled in the art to which the invention pertains from a review of the detailed description that follows.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
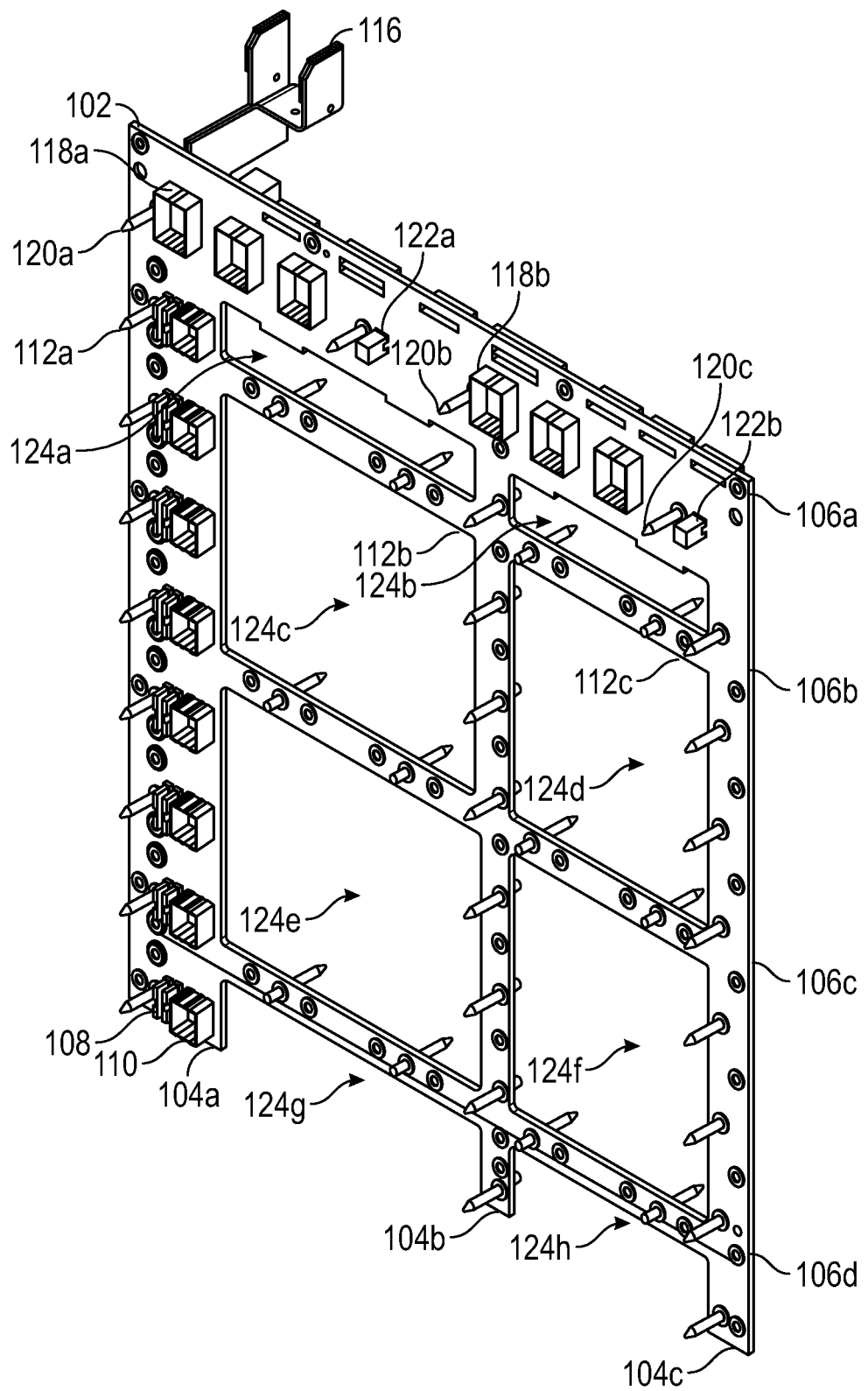
FIG. 1 is an exemplary perspective view of one side of a midplane with affixed power bus in accordance with an embodiment of the invention.

In the following description various aspects of the present invention, an apparatus and process for a midplane supporting orthogonal direct connection of components will be described. Specific details will be set forth in order to provide a thorough understanding of the present invention. However, it will be apparent to those skilled in the art that the present invention may be practiced with only some or all of the described aspects of the present invention, and with or without some or all of the specific details. In some instances, well known architectures, steps, and techniques have not been shown to avoid unnecessarily obscuring the present invention. For example, specific details are not provided as to whether the process and apparatus is implemented in a packet forwarding device such as a switch, router, bridge, server or gateway, or whether the process and apparatus employ software, hardware circuitry, firmware, or a combination thereof.

Parts of the description will be presented using terminology commonly employed by those skilled in the art to convey the substance of their work to others skilled in the art, including terms of operations performed by, for example, a computer system or a packet-forwarding device, and their operands. As well understood by those skilled in the art, these operands take the form of electrical, magnetic, or optical signals, and the operations involve storing, transferring, combining, and otherwise manipulating the signals through electrical, magnetic or optical components of a system. The term system includes general purpose as well as special purpose arrangements of these components that are standalone, adjunct or embedded.

Various operations will be described as multiple discrete steps performed in turn in a manner that is most helpful in understanding the present invention. However, the order of description should not be construed as to imply that these operations are necessarily performed in the order they are presented, or even order dependent. Lastly, reference throughout this specification to "one embodiment," "an embodiment," or "an aspect," means that the particular feature, structure, or characteristic that is described is included in at least one embodiment of the invention, but not necessarily in the same embodiment. Furthermore, the particular features, structures, or characteristics may be combined in any suitable manner in one or more embodiments.

To date, network devices which employ orthogonal connectivity use a conventional midplane that typically requires a shroud and pins to connect a horizontal component to a vertical component. This type of connection requires the use of a solid printed circuit board midplane to be employed between the horizontal and vertical components, as well as the installation of a connector in the midplane itself. However, orthogonal connectors that directly connect components to one another are now available, bypassing the midplane entirely. Embodiments of the present invention take advantage of the availability of orthogonal direct connectors by providing a novel midplane shaped with voids through which the dataplane connections are made between components on one side of the midplane and components on the opposite side of the midplane.

The voids in the embodiments of the novel midplane of the present invention offer numerous advantages over conventional solid midplanes. For example, conventional midplanes for orthogonal systems require the use of air plenums which can significantly increase the height of the chassis to accommodate an air inlet plenum and an exhaust inlet plenum. In contrast, embodiments of the novel midplane of the present invention support improved airflow between components in a minimal chassis footprint. For example, the voids advantageously allow airflow in both directions, front to back or back to front. The improved airflow of the novel midplane reduces or eliminates the use of an air plenum. Thus, the novel midplane allows for greater density of high power components, which advantageously increases the bandwidth per rack unit of the network devices in which it is employed.

Another advantage of the voids in the novel midplane is that they allow the direct connection of the dataplane components (the I/O blades and the Fabric Modules) without the need for a pin-field in the midplane. The absence of the pin-field aids in improving signal integrity by limiting the number of pin and printed circuit board (PCB) connections, impedance mismatches and reflection stubs, all of which allow for greater serializer/de-serializer (SERDES) rates to be used in the network device.

Yet another advantage of the voids in the novel midplane is that they allow upgrades to newer dataplane connectors without impacting the design of the midplane or chassis. For example, the size of the voids in the novel midplane is such that the only change needed is to replace the modular blades or fabric components with the newer dataplane connectors. Without the midplane locking the chassis design into a specific dataplane connector selection, the chassis can to a great degree be "future proofed."

In addition to the advantages of the voids in the novel midplane, the minimal structure that forms the shape of the novel midplane facilitates proper mechanical alignment between the orthogonally directly connected components at a minimal cost because it avoids the greater expense of specialized orthogonal connectors with their own alignment mechanisms and the resulting mechanical and connector limitations. This too has the effect of freeing up the chassis design by not locking the design into a specific dataplane connector selection.

In view of the foregoing considerations, in one embodiment, the novel midplane of the present invention provides power, non-datapath control connectivity and mechanical alignment while configured to optimize cooling and improve signal integrity and performance of the dataplane. The novel midplane also advantageously allows for future upgrades of the datapath connections without having to remove or replace the midplane and/or chassis components of the network device. The following paragraphs and accompanying drawings describe non-limiting exemplary embodiments of the novel midplane.

FIG. 1 is an exemplary perspective view of one side of a midplane with affixed power bus in accordance with an embodiment of the invention. As illustrated in FIG. 1, a midplane 102 is shaped from structural members in a window-pane design creating a plurality of voids that provide sufficient openings for the orthogonal and direct connection of a plurality of dataplane components as well as improved airflow. Specifically, the structural members include vertical members 104a-c and horizontal members 106a-d forming eight rectangular voids 124a-h (with voids 124g-h shown as open-ended in this particular embodiment). It should be understood that the number of members and voids formed may vary depending on the particular network device for which the midplane is being designed.

Figure 5:
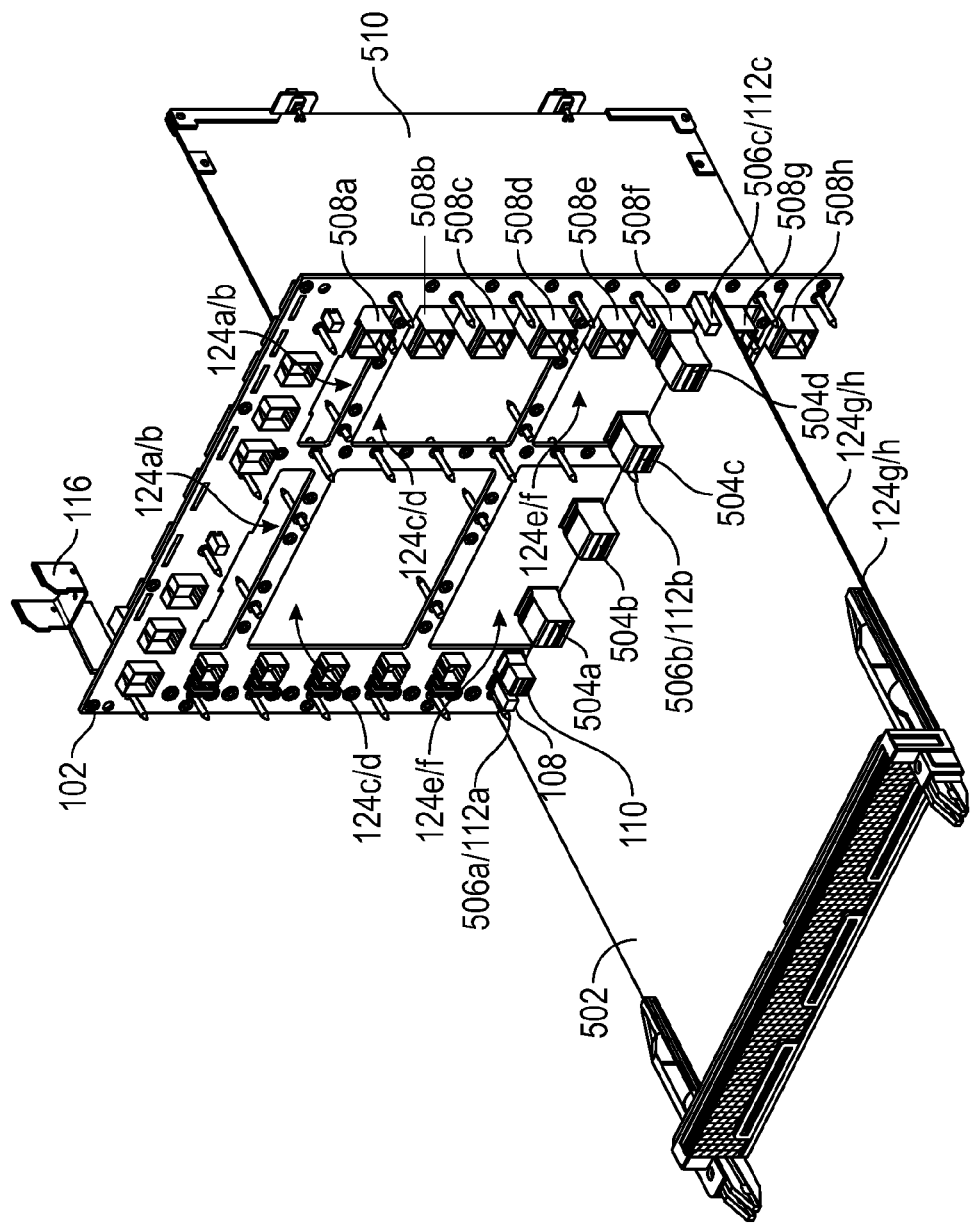
FIG. 5 is an exemplary perspective view of one side of the midplane with affixed power bus supporting orthogonally and directly connected dataplane components in accordance with an embodiment of the invention.
Figure 6:
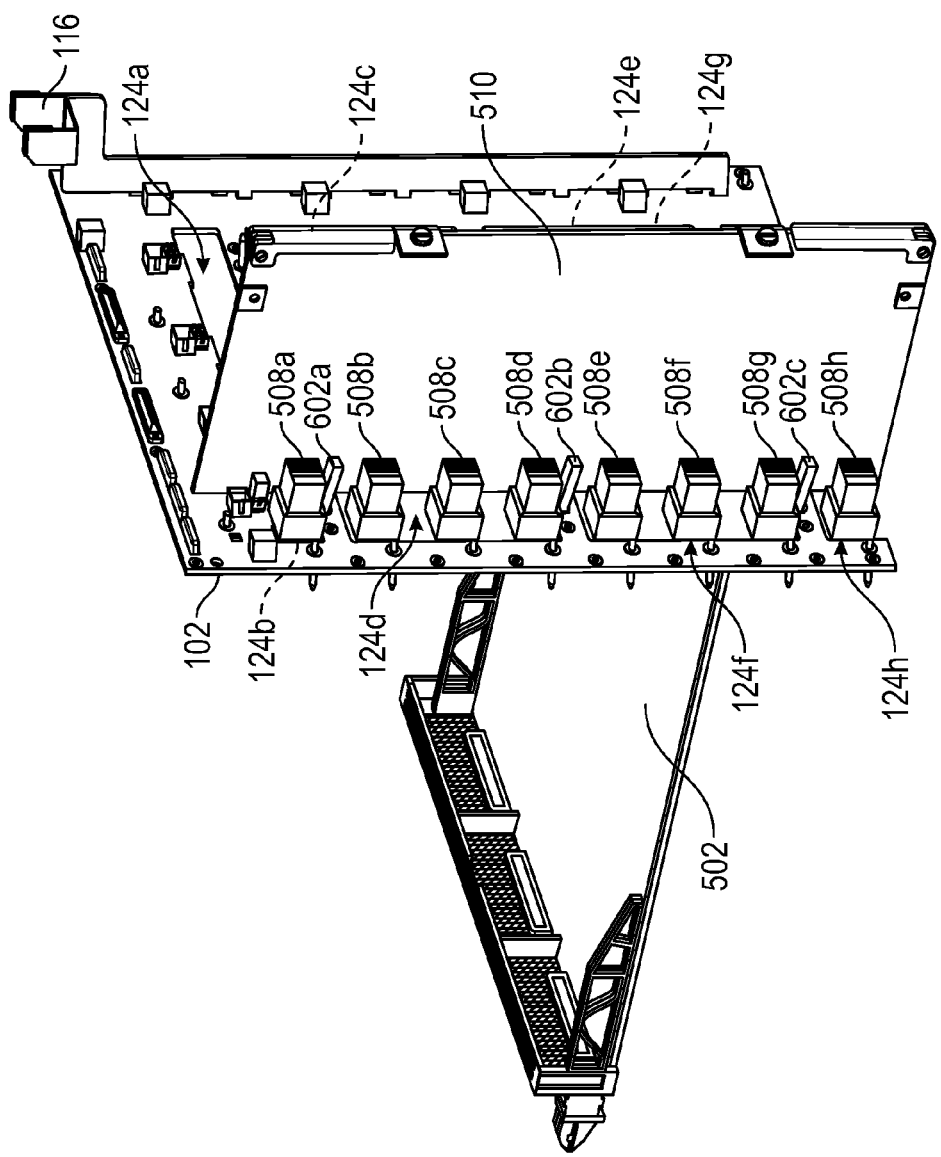
FIG. 6 is an exemplary perspective view of an opposite side of the midplane with affixed power bus supporting orthogonally and directly connected dataplane components of FIG. 5 in accordance with an embodiment of the invention.

In one embodiment the vertical members 104a-c of the midplane 102 are each equipped with a column 112a-c of alignment pins that facilitate the horizontal alignment of the dataplane components. For example, in this case the illustrated midplane 102 is shown with the I/O blade side facing, and the I/O blades of the dataplane components are to be inserted horizontally using the columns 112a-c of alignment pins to insure their proper insertion. Note, the dataplane components are not shown in FIG. 1 and FIG. 2 for clarity of illustration, but are shown in FIGS. 5-6.

In the illustrated embodiment, the midplane 102 is equipped with additional non-datapath sets of connectors 118a-b and 122a-b, as well as additional alignment pins 120a-c along the length of the uppermost horizontal structural member 106a for ease of access. In a typical embodiment, this member 106a is constructed with additional width to accommodate the non-datapath and other mechanical alignment features. In a similar manner, along the leftmost side of the illustrated embodiment, the leftmost vertical structural member 104a of midplane 102 is also equipped with additional non-datapath sets of connectors 108, 110 along the length of the member, and is constructed with additional width to accommodate these features.

In the illustrated embodiment, the leftmost vertical structural member also accommodates the power strip 116 affixed to the midplane 102 on the opposite side which will be described with more detail in FIG. 2. In a typical embodiment, the inner vertical structural members, such as the illustrated member 104b are also used to carry non-datapath signals and power connections between connectors.

Figure 2:
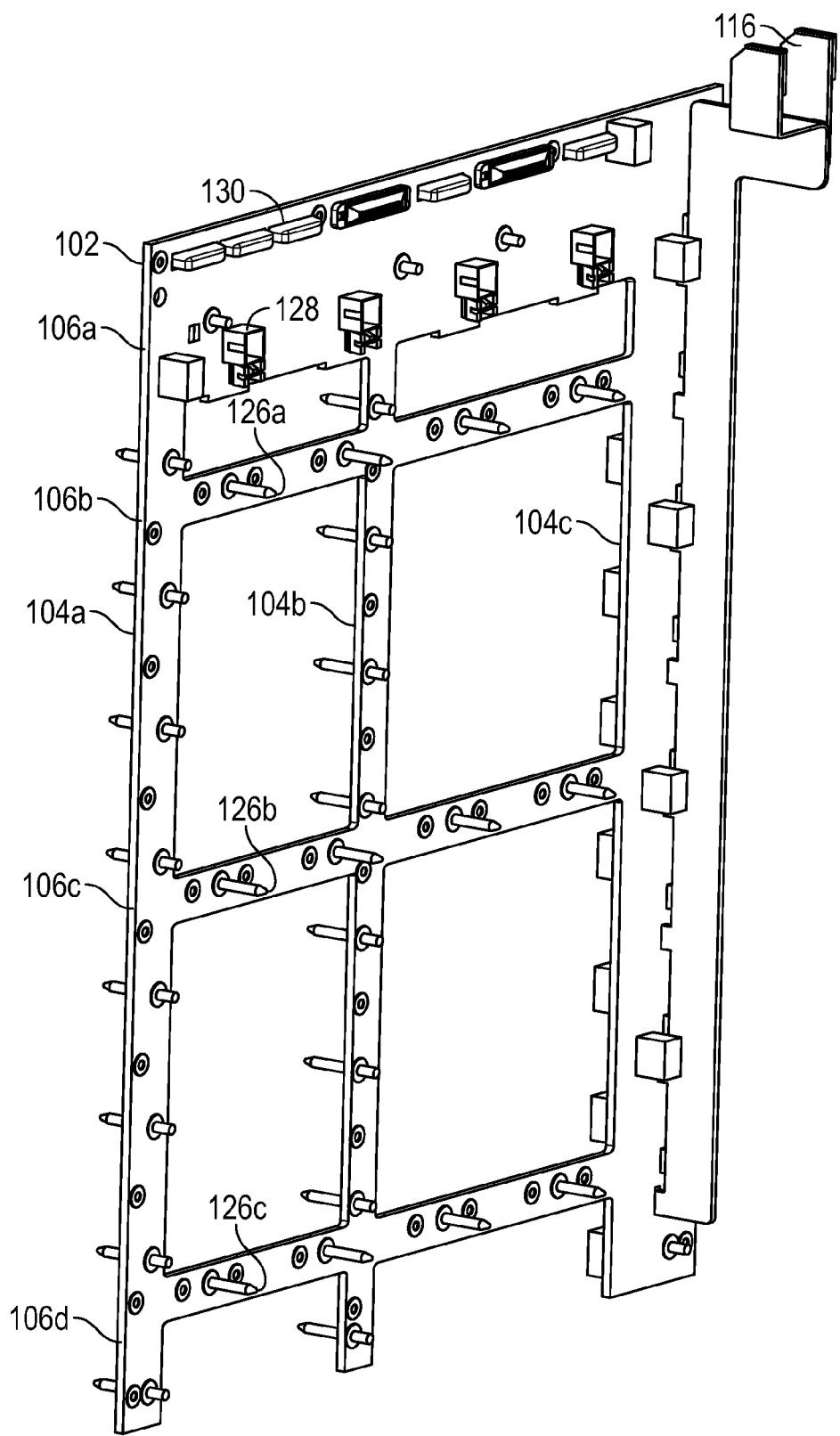
FIG. 2 is an exemplary perspective view of an opposite side of the midplane with affixed power bus illustrated in FIG. 1 in accordance with an embodiment of the invention.

FIG. 2 is an exemplary perspective view of an opposite side of the midplane illustrated in FIG. 1, shown with affixed power bus in accordance with an embodiment of the invention. As illustrated in FIG. 2, the power bus 116 is affixed down the length of the leftmost (rightmost in perspective view of FIG. 2) vertical structural member 104a of midplane 102 to support the necessary power and non-datapath connectivity provided by the midplane. By utilizing a bus bar, the need to widen one side of the midplane to carry a large current for distribution to the midplane is eliminated, which in turn allows the size of the voids/openings to be maximized for cooling and dataplane connections.

In one embodiment, this side of midplane 102 further illustrates that the horizontal structural members 106b-d are equipped with rows 126a-c of alignment pins along the length of the members to facilitate the vertical alignment of the fabric components of the dataplane, in particular to insure that the intersections of the dataplane components are properly placed within the voids 124a-g of the midplane and properly supported to allow for secure orthogonal direct connection. The uppermost horizontal structural member 106a is further equipped with additional non-datapath sets of connectors 128, 130 along the length of the member. In a typical embodiment, the inner horizontal structural members, such as the illustrated members 106b and 106c, are also used to carry non-datapath signals and power connections between connectors.

Figure 3:
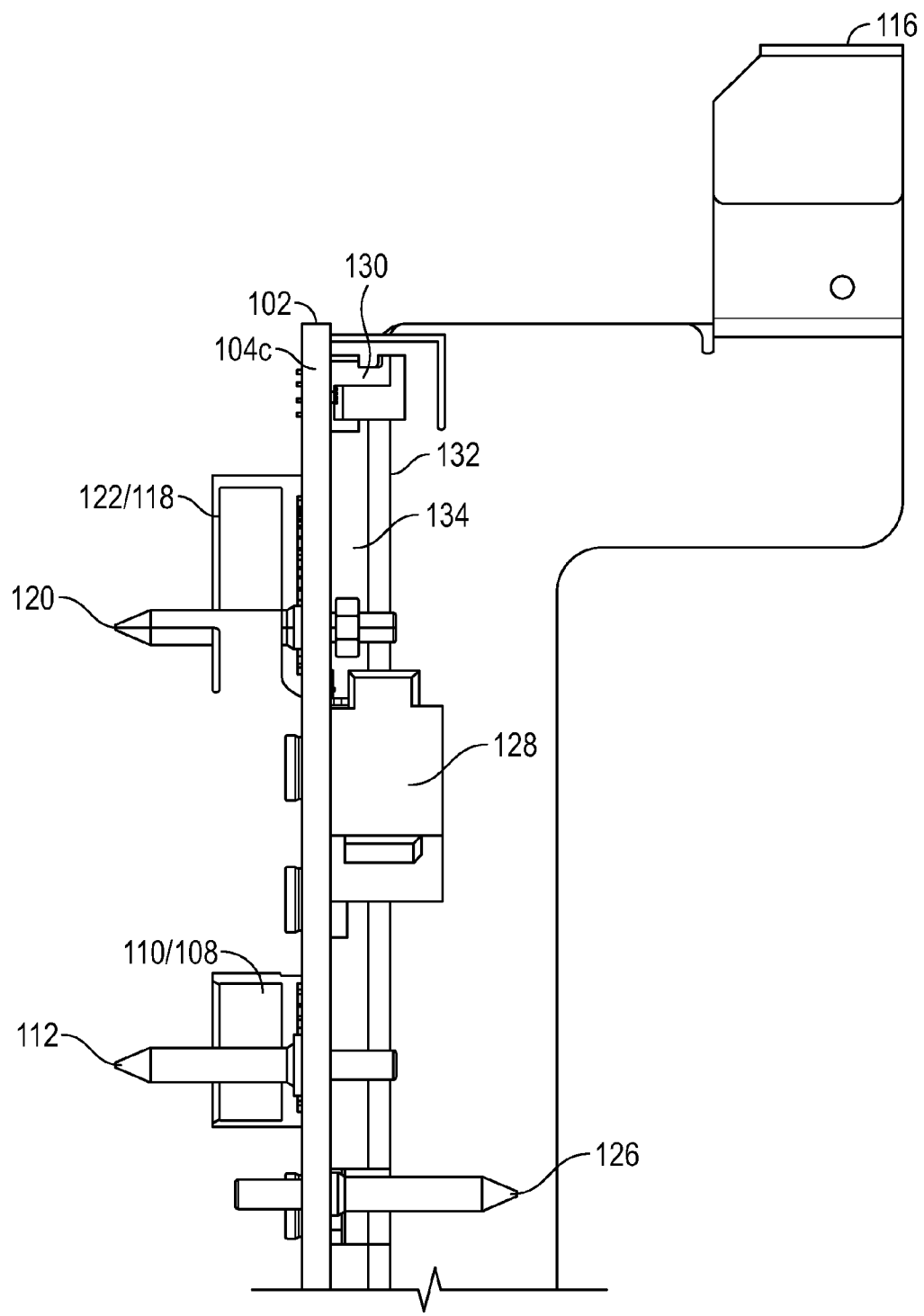
FIG. 3 is an exemplary enlarged elevation partial view of one side of the midplane with affixed power bus illustrated in FIG. 1 in accordance with an embodiment of the invention.
Figure 4:
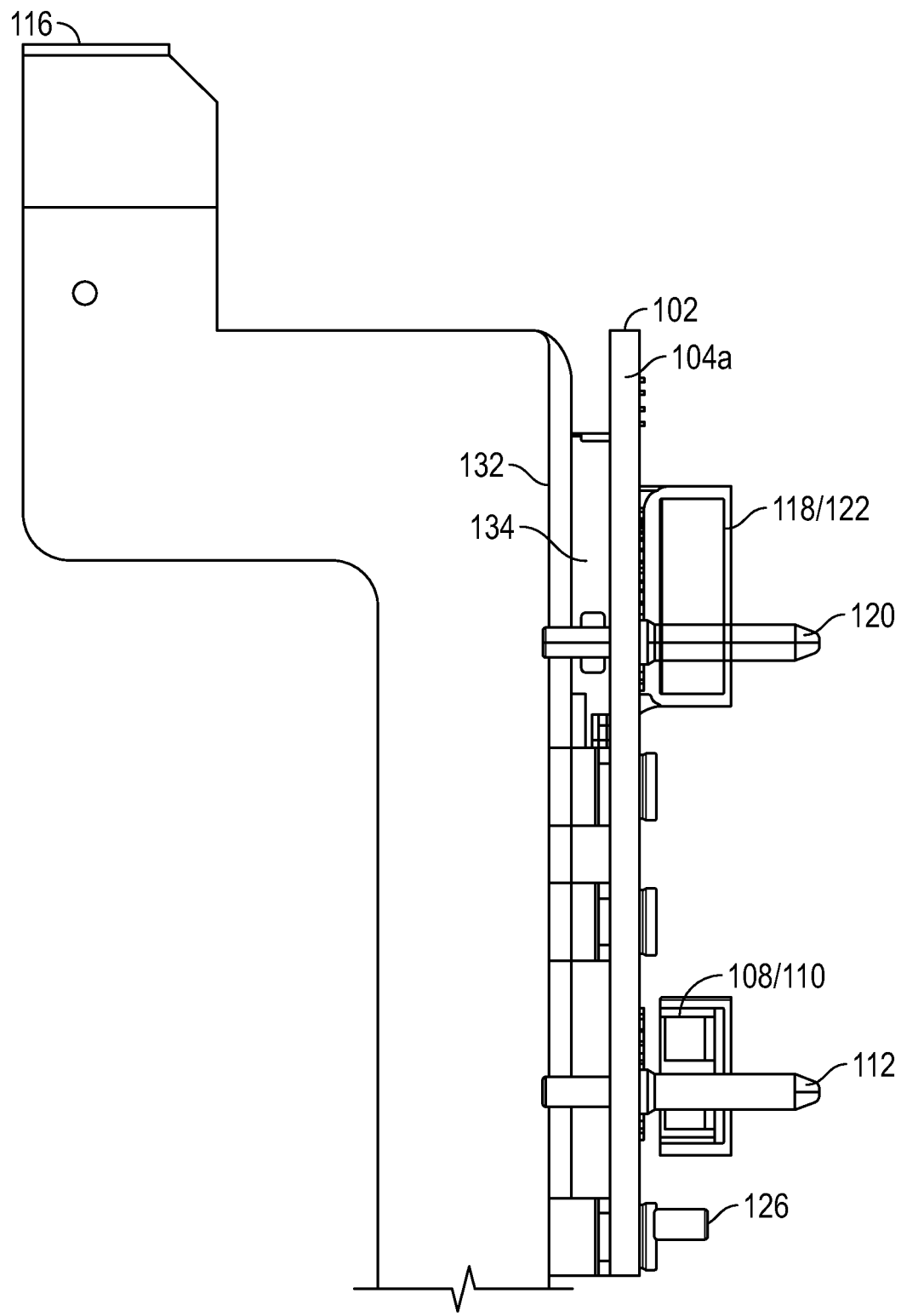
FIG. 4 is an exemplary enlarged elevation partial view of the opposite side of the midplane with affixed power bus illustrated in FIG. 3 in accordance with an embodiment of the invention.

FIGS. 3-4 are exemplary enlarged elevation partial views of the right and left sides respectively of the midplane illustrated in FIG. 1, illustrating in greater detail certain aspects of the midplane with the affixed power bus in accordance with an embodiment of the invention. For example, in FIG. 3 the midplane 102 is shown with affixed power bus 116, and with vertical structural member 104c in the foreground view. FIG. 3 further illustrates the side profile of various sets of non-datapath connectors 130, 128, 122, 118, 108 and 110. In addition, the side profile of the various sets of alignment pins 120, 112 and 126 are also shown. Likewise, in FIG. 4, the same features are shown from the opposite side perspective. Because the view in FIG. 4 shows the power bus in the foreground, certain features are obscured, such as the obscured view of alignment pins 126. In each of FIG. 3 and FIG. 4 is shown an insulation layer 132 and spacing 134 between the midplane 102 and the affixed power bus 116.

FIG. 5 is an exemplary perspective view of one side of the midplane 102 with affixed power bus 116 supporting orthogonally and directly connected dataplane components in accordance with an embodiment of the invention. For example, in FIG. 5, the I/O blade side of the midplane 102 is shown with a single I/O blade 502 inserted in order to avoid obscuring features of the invention. The rear facing fabric side of the midplane 102 is shown with a single corresponding fabric component 510 inserted, again to avoid obscuring features of the invention. As illustrated the I/O blade 502 is engaged at various intervals along the length of the blade with one side of four orthogonal direct connectors 504a-d. In addition, the I/O blade 502 is horizontally inserted into midplane 102 using alignment pins 112a-c, each of which is encased within alignment pin covers 506a-c to insure proper mechanical alignment of I/O blade 502 in midplane 102.

In FIG. 5, inserted into the rear of the midplane 102, or fabric side of the midplane, is the one fabric component 510, which is equipped with eight orthogonal direct connectors 508a-h engaged at various intervals along the length of fabric component 510. In one embodiment, at the intersection of I/O blade 502 and fabric component 510, the orthogonal direct connector 504d is shown to be mated with the corresponding orthogonal connector 508f through the void 124f in midplane 102. In a typical embodiment the mating connectors 504d/

508f are a set of male/female connectors that form a mated connection between the I/O blade 502 and fabric component 510 through the void 124f without attaching to the midplane 102. The orthogonal direct connectors 504/508 are typically provided by third party suppliers and can be upgraded with any orthogonal direct connectors that can be accommodated through the voids 124 without impacting the midplane 102. Additional I/O blades 502 and fabric components 510 may be inserted in a similar manner into midplane 102 to form a dataplane.

FIG. 6 is an exemplary perspective view of the opposite side of the midplane 102 shown in FIG. 5 with affixed power bus and supporting orthogonally and directly connected dataplane components in accordance with an embodiment of the invention. For example, in FIG. 6, the fabric side of the midplane 102 is shown with the single fabric component 510 inserted into the midplane and engaged at various intervals along the length of the fabric component with one side of eight orthogonal direct connectors 508a-h. In addition, the fabric component 510 is vertically inserted into the midplane 102 using alignment pins 126a-c, each of which is shown encased within alignment pin covers 602a-c to insure proper mechanical alignment of fabric component 510 in midplane 102. As shown, at the intersection of I/O blade 502 and fabric component 510, the orthogonal direct connector 508f is shown to be mated with the corresponding orthogonal connector 504d through the void 124f in midplane 102. Additional I/O blades 502 and fabric components 510 may be inserted in a similar manner into midplane 102 to form a dataplane. For example, in the illustrated embodiment of midplane 102 a total of four fabric components and eight I/O blades may be accommodated. However, it should be understood that other configurations of midplane 102 may accommodate greater or fewer I/O blade and fabric components, depending on the size of the dataplane that is desired.

Figure 7:
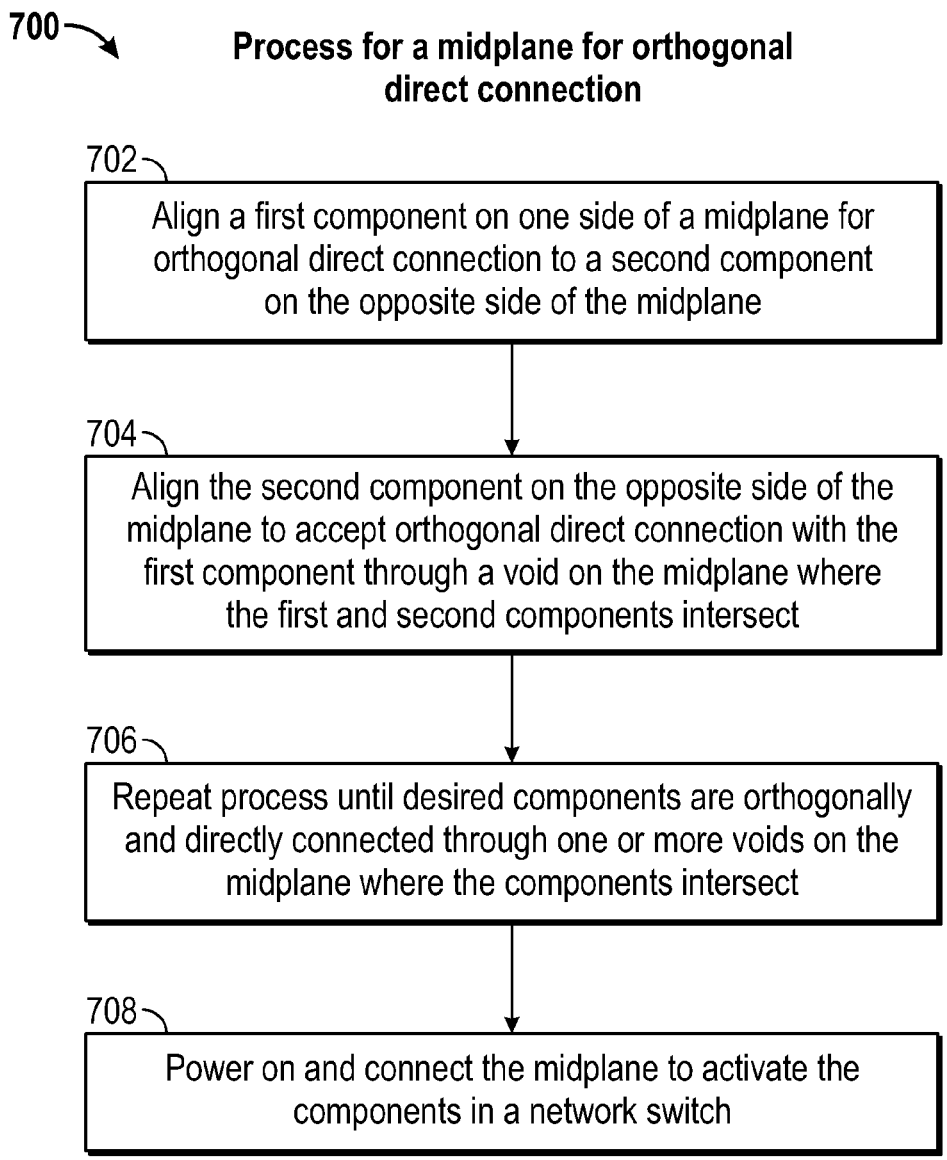
FIG. 7 is a flow diagram of an exemplary process for using the midplane to support orthogonally and directly connected dataplane components as illustrated in FIGS. 1-6 and in accordance with an embodiment of the invention.

FIG. 7 is a flow diagram of an exemplary process for using the midplane 102 to support orthogonally and directly connected dataplane components as illustrated in FIGS. 1-6 and in accordance with an embodiment of the invention. For example, in the illustrated process 700 for a midplane for supporting orthogonal direct connection dataplane components, the process 700 begins at process 702 with aligning a first component of the dataplane on one side of the midplane so that it can be orthogonally and directly connected to a second component on the opposite side of the midplane. For example, the alignment pins and corresponding covers on a first component are used to insert the first component vertically.

The process 700 continues at process 704 with aligning a second component of the dataplane on the opposite side of the midplane to accept orthogonal direct connection with the first component. In particular, aligning the second component is performed so that the components are connected using orthogonal direct connectors through a void on the midplane which is large enough to accommodate the connection at the location where the first and second components intersect.

The process 700 continues at process 706 to repeat processes 702 and 704 until all of the desired components are orthogonally and directly connected through one or more voids on the midplane where the components intersect. Once alignment, insertion and connection is complete, the process 700 concludes at process 708 to power on and connect the midplane to activate the dataplane components in the network device in which they were installed.

It is to be appreciated that various components of the illustrated midplane 102 may be rearranged, and that certain implementations of the present invention may not require nor include all of the above components. Furthermore, additional components may be included in midplane 102, such as additional power and network/communication interfaces, etc.

Accordingly, a novel apparatus and process is described for a midplane for orthogonal direct connection of dataplane components. From the foregoing description, those skilled in the art will recognize that many other variations of the present invention are possible. In particular, while the present invention has been described as being implemented in a windowpane shape having vertical and horizontal structural members and rectangular openings that form the voids through which the dataplane is constructed, other shapes and structural members having other orientations and/or openings that form the voids may be employed as long as they are sufficient in size and number to support orthogonal direct connection of dataplane components. Thus, the present invention is not limited by the details described. Instead, the present invention can be practiced with modifications and alterations within the spirit and scope of the appended claims.

What is claimed is:

1. An apparatus for a midplane for orthogonal direct connection of dataplane components, the apparatus comprising:
   a plurality of structural members shaped in a single plane to create voids through which a dataplane can be formed, the voids having an absence of structural members, wherein the plurality of structural members consists of:
      a first set of structural members in a first orientation, the first set of structural members having pins distributed across one side of the single plane, and
      a second set of structural members in a second orientation relative to the first orientation, the second set of structural members having pins distributed across an opposite side of the single plane;
   wherein the pins support alignment of dataplane components on the one side of the single plane orthogonal to dataplane components on the opposite side of the single plane for direct connection through the voids at the orthogonal dataplane components' respective points of intersection, the direct connection being made within the voids and without the use of pinfields in any of the plurality of structural members, the direct connection to improve signal integrity across the dataplane.

2. The apparatus for the midplane of claim 1, further comprising at least one outermost structural member having non-datapath features to support the midplane functions, the non-datapath features including any one of more of non-datapath connections and power bus bars.

3. The apparatus of claim 1, wherein the second orientation is perpendicular relative to the first orientation to create voids that are rectangular.

4. The apparatus of claim 1, wherein direct connection is made through the voids using orthogonal direct connectors attached to each of the orthogonal dataplane components at their respective points of intersection.

5. A method for a midplane supporting orthogonal direct connection of dataplane components, the method comprising:
   assembling a midplane in single plane with voids through which dataplane components are inserted, the voids having an absence of structural elements, wherein the midplane consists of:
      horizontal elements with alignment pins protruding from one side of the midplane, and
      vertical elements with alignment pins protruding from an opposite side of the midplane;
   wherein the alignment pins support orthogonal alignment of opposing dataplane components on opposite sides of the midplane for direct connection through the voids at the orthogonal dataplane components' respective points of intersection, the direct connection being made within the voids and without the use of pinfields in any of the horizontal and vertical elements, the direct connection improving signal integrity across the dataplane.

6. The method of claim 5, further comprising providing any one or more of the horizontal and vertical elements with non-datapath features to support the midplane functions, the non-datapath features including any one of more of non-datapath connections and power bus bars.

7. The method of claim 5, wherein direct connection is made through the voids using orthogonal direct connectors attached to the orthogonal dataplane components at their respective points of intersection.

8. A midplane comprising:
a windowpane structure having openings through which dataplane components can be orthogonally and directly connected, the openings having an absence of windowpane structure, the windowpane structure having pins distributed vertically on one side and horizontally on an opposite side, wherein the pins support alignment of the dataplane components on the one side orthogonal to dataplane components on the opposite side, the orthogonal dataplane components directly connected through the openings at their respective points of intersection, the orthogonal data components having been directly connected within the voids and without the use of pinfields in any of the windowpane structure for improved signal integrity across the dataplane.

9. The midplane of claim 8, wherein an outermost portion of the windowpane structure is provided with non-datapath features to support the operation of the midplane, the non-datapath features including any one of more of non-datapath connections and power bus bars.

10. The midplane of claim 8, wherein the orthogonal dataplane components are directly connected to one another though the openings using orthogonal direct connectors attached to the orthogonal dataplane components at their respective points of intersection.

11. The midplane of claim 8, wherein the dataplane components on the one side of the windowpane structure are fabric modules and the dataplane components on the opposite side are I/O modules.

12. A system for a midplane for orthogonal direct connection of dataplane components, the system comprising:
means for providing a midplane in a single plane, the midplane having voids through which a dataplane can be formed, the voids having an absence of midplane structure;
means for aligning dataplane components on the one side of the single plane orthogonal to dataplane components aligned on the opposite side of the single plane; and
means for increasing signal integrity across the dataplane, including means for directly connecting dataplane components through the voids at the dataplane components' respective points of intersection, the means for directly connecting carried out within the voids and without the use of midplane structure.

13. The system of claim 12, further comprising:
means for increasing cooling performance of the midplane, including means for permitting airflow in both directions through the voids.

14. The system of claim 12, further comprising:
means for increasing bandwidth of the dataplane, including means for minimizing rack unit space while maximizing interface density.

15. The system of claim 12, wherein the means for increasing signal integrity across the dataplane further includes means for eliminating midplane datapath signaling connections.

16. The system of claim 12, further comprising:
means for upgrading the means for directly connecting dataplane components without impacting the midplane or chassis within which the midplane is assembled.

* * * * *